United States Patent
Gorrell (10) Patent No.: US 7,282,776 B2
(45) Date of Patent: Oct. 16, 2007

(54) METHOD AND STRUCTURE FOR COUPLING TWO MICROCIRCUITS

(75) Inventor: Jonathan Gorrell, Gainesville, FL (US)

(73) Assignee: Virgin Islands Microsystems, Inc., Saint Thomas, VI (US)

( * ) Notice: Subject to any disclaimer, the term of this patent is extended or adjusted under 35 U.S.C. 154(b) by 126 days.

(21) Appl. No.: 11/349,963

(22) Filed: Feb. 9, 2006

(65) Prior Publication Data

US 2007/0183717 A1   Aug. 9, 2007

(51) Int. Cl.
*H01L 31/115* (2006.01)
(52) U.S. Cl. .............................. 257/429; 257/E23.002
(58) Field of Classification Search ................. 257/429
See application file for complete search history.

(56) References Cited

U.S. PATENT DOCUMENTS

| | | | |
|---|---|---|---|
| 2,634,372 A | 4/1953 | Salisbury |
| 3,923,568 A | 12/1975 | Bersin |
| 4,727,550 A | 2/1988 | Chang et al. |
| 4,740,973 A | 4/1988 | Madey |
| 4,829,527 A | 5/1989 | Wortman et al. |
| 5,023,563 A | 6/1991 | Harvey et al. |
| 5,157,000 A | 10/1992 | Elkind et al. |
| 5,185,073 A | 2/1993 | Bindra |
| 5,199,918 A | 4/1993 | Kumar |
| 5,262,656 A | 11/1993 | Blondeau et al. |
| 5,263,043 A | 11/1993 | Walsh |
| 5,268,788 A | 12/1993 | Fox et al. |
| 5,302,240 A | 4/1994 | Hori et al. |
| 5,446,814 A | 8/1995 | Kuo et al. |
| 5,668,368 A | 9/1997 | Sakai et al. |
| 5,705,443 A | 1/1998 | Stauf et al. |
| 5,744,919 A | 4/1998 | Mishin et al. |
| 5,757,009 A | 5/1998 | Walstrom |

(Continued)

FOREIGN PATENT DOCUMENTS

EP   0237559 B1   12/1991

(Continued)

OTHER PUBLICATIONS

Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.

(Continued)

*Primary Examiner*—Evan Pert
(74) *Attorney, Agent, or Firm*—Davidson Berquist Jackson & Gowdey LLP (57) ABSTRACT

A system in a package (SIP) or multi-chip module (200, 300, 400) (MCM) uses an electron beam (235, 335, 435) for electrically coupling between microcircuits (230, 330, 430) and (232, 332, 432). In one embodiment, the micro-circuits (230, 430) and (232, 432) can be configured in a side-by-side configuration. In another embodiment, the micro-circuits (330) and (332) can be configured in a chip-on-chip configuration. In yet another embodiment, the electron beam (435) can include a plurality of electron beams (436) and appear as ribbon shaped between two micro-circuits (430, 432). Further, the fabrication to form the electron source (234, 334, 434) and the deflector (261, 356, 461) can be at the final metallization step of the process.

41 Claims, 5 Drawing Sheets

U.S. PATENT DOCUMENTS

| | | | |
|---|---|---|---|
| 5,767,013 | A | 6/1998 | Park |
| 5,790,585 | A | 8/1998 | Walsh |
| 5,831,270 | A | 11/1998 | Nakasuji |
| 6,040,625 | A | 3/2000 | Ip |
| 6,060,833 | A | 5/2000 | Velazco |
| 6,080,529 | A | 6/2000 | Ye et al. |
| 6,195,199 | B1 | 2/2001 | Yamada |
| 6,222,866 | B1 | 4/2001 | Seko |
| 6,297,511 | B1 | 10/2001 | Syllaios et al. |
| 6,370,306 | B1 | 4/2002 | Sato et al. |
| 6,373,194 | B1 | 4/2002 | Small |
| 6,545,425 | B2 | 4/2003 | Victor |
| 6,603,915 | B2 | 8/2003 | Glebov et al. |
| 6,738,176 | B2 | 5/2004 | Rabinowitz et al. |
| 6,741,781 | B2 | 5/2004 | Furuyama |
| 6,829,286 | B1 | 12/2004 | Guilfoyle et al. |
| 6,885,262 | B2 | 4/2005 | Nishimura et al. |
| 6,909,104 | B1 | 6/2005 | Koops |
| 6,995,406 | B2 | 2/2006 | Tojo et al. |
| 7,092,588 | B2 | 8/2006 | Kondo |
| 7,092,603 | B2 | 8/2006 | Glebov et al. |
| 7,122,978 | B2 | 10/2006 | Nakanishi et al. |
| 2001/0025925 | A1 | 10/2001 | Abe et al. |
| 2003/0012925 | A1 | 1/2003 | Gorrell |
| 2003/0034535 | A1 | 2/2003 | Barenburu et al. |
| 2004/0108473 | A1 | 6/2004 | Melnychuk et al. |
| 2004/0136715 | A1 | 7/2004 | Kondo |
| 2004/0150991 | A1 | 8/2004 | Ouderkirk et al. |
| 2004/0171272 | A1 | 9/2004 | Jin et al. |
| 2004/0213375 | A1 | 10/2004 | Bjorkholm et al. |
| 2004/0231996 | A1 | 11/2004 | Webb |
| 2004/0264867 | A1 | 12/2004 | Kondo |
| 2005/0023145 | A1 | 2/2005 | Cohen et al. |
| 2005/0067286 | A1 | 3/2005 | Ahn et al. |
| 2005/0162104 | A1 | 7/2005 | Victor et al. |
| 2005/0190637 | A1 | 9/2005 | Ichimura et al. |
| 2005/0194258 | A1 | 9/2005 | Cohen et al. |
| 2005/0201707 | A1 | 9/2005 | Glebov et al. |
| 2006/0007730 | A1 | 1/2006 | Nakamura et al. |
| 2006/0035173 | A1 | 2/2006 | Davidson et al. |
| 2006/0045418 | A1 | 3/2006 | Cho et al. |
| 2006/0062258 | A1 | 3/2006 | Brau et al. |

FOREIGN PATENT DOCUMENTS

| | | |
|---|---|---|
| JP | 2004-32323 A | 1/2004 |
| WO | WO 87/01873 | 3/1987 |
| WO | WO 93/21663 A1 | 10/1993 |
| WO | WO 00/72413 | 11/2000 |
| WO | WO 02/25785 | 3/2002 |
| WO | WO 02/077607 | 10/2002 |
| WO | WO 2004/086560 | 10/2004 |
| WO | WO 2005/015143 A2 | 2/2005 |
| WO | WO 2006/042239 A2 | 4/2006 |

OTHER PUBLICATIONS

Markoff, John, "A Chip That Can Transfer Data Using Laser Light," The New York Times, Sep. 18, 2006.

S.M. Sze, "Semiconductor Devices Physics and Technology", 2nd Edition, Chapters 9 and 12, Copyright 1985, 2002.

Search Report and Written Opinion mailed Feb. 12, 2007 in PCT Appln. No. PCT/US2006/022682.

Search Report and Written Opinion mailed Feb. 20, 2007 in PCT Appln. No. PCT/US2006/022676.

Search Report and Written Opinion mailed Feb. 20, 2007 in PCT Appln. No. PCT/US2006/022772.

Search Report and Written Opinion mailed Feb. 20, 2007 in PCT Appln. No. PCT/US2006/022780.

Search Report and Written Opinion mailed Feb. 21, 2007 in PCT Appln. No. PCT/US2006/022684.

Search Report and Written Opinion mailed Jan. 17, 2007 in PCT Appln. No. PCT/US2006/022777.

Search Report and Written Opinion mailed Jan. 23, 2007 in PCT Appln. No. PCT/US2006/022781.

Search Report and Written Opinion mailed Mar. 7, 2007 in PCT Appln. No. PCT/US2006/022775.

Speller et al., "A Low-Noise MEMS Accelerometer for Unattended Ground Sensor Applications", Applied MEMS Inc., 12200 Parc Crest, Stafford, TX, USA 77477.

Thurn-Albrecht et al., "Ultrahigh-Density Nanowire Arrays Grown in Self-Assembled Diblock Copolymer Templates", Science 290. 5499, Dec. 15, 2000, pp. 2126-2129.

S. Hoogland et al., "A solution-processed 1.53 µm quantum dot laser with temperature-invariant emission wavelength," Optics Express, vol. 14, No. 8, Apr. 17, 2006, pp. 3273-3281.

"Array of Nanoklystrons for Frequency Agility or Redundancy," NASA's Jet Propulsion Laboratory, NASA Tech Briefs, NPO-21033. 2001.

"Hardware Development Programs," Calabazas Creek Research, Inc. found at http://calcreek.com/hardware.html.

"Antenna Arrays." May 18, 2002. www.tpub.com/content/neets/14183/css/14183_159.htm.

"Diffraction Grating," hyperphysics.phy-astr.gsu.edu/hbase/phyopt/grating.html.

Alford, T.L. et al., "Advanced silver-based metallization patterning for ULSI applications," Microelectronic Engineering 55, 2001, pp. 383-388, Elsevier Science B.V.

Amato, Ivan, "An Everyman's Free-Electron Laser?" Science, New Series, Oct. 16, 1992, p. 401, vol. 258 No. 5081, American Association for the Advancement of Science.

Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.

Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.

Bakhtyari, A. et al., "Horn Resonator Boosts Miniature Free-Electron Laser Power," Applied Physics Letters, May 12, 2003, pp. 3150-3152, vol. 82, No. 19, American Institute of Physics.

Bakhtyari, Dr. Arash, "Gain Mechanism in a Smith-Purcell MicroFEL," Department of Physics and Astronomy, Dartmouth College, Abstract.

Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.

Booske, J.H. et al., "Microfabricated TWTs as High Power, Wideband Sources of THz Radiation".

Brau, C.A. et al., "Gain and Coherent Radiation from a Smith-Purcell Free Electron Laser," Proceedings of the 2004 FEL Conference, pp. 278-281.

Brownell, J.H. et al., "Improved µFEL Performance with Novel Resonator," Jan. 7, 2005, from website: www.frascati.enea.it/thz-bridge/workshop/presentations/Wednesday/We-07-Brownell.ppt.

Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.

Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.

Chuang, S.L. et al., "Smith-Purcell Radiation from a Charge Moving Above a Penetrable Grating," IEEE MTT-S Digest, 1983, pp. 405-406, IEEE.

Far-IR, Sub-MM & MM Detector Technology Workshop list of manuscripts, session Jun. 2002.

Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp. 584-597.

Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.

Gallerano, G.P. et al., "Overview of Terahertz Radiation Sources," Proceedings of the 2004 FEL Conference, pp. 216-221.

Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.

Gover, A. et al., "Angular Radiation Pattern of Smith-Purcell Radiation," Journal of the Optical Society of America, Oct. 1984, pp. 723-728, vol. 1 No. 5, Optical Society of America.

Grishin, Yu. A. et al., "Pulsed Orotron—A New Microwave Source for Submillimeter Pulse High-Field Electron Paramagnetic Resonance Spectroscopy," Review of Scientific Instruments, Sep. 2004, pp. 2926-2936, vol. 75 No. 9, American Institute of Physics.

Ishizuka, H. et al.; "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.

Ishizuka, H. et al.; "Smith-Purcell Radiation Experiment Using a Field-Emission Array Cathode," Nuclear Instruments and Methods in Physics Research, 2000, pp. 276-280, A 445, Elsevier Science B.V.

Ives, Lawrence et al., "Development of Backward Wave Oscillators for Terahertz Applications," Terahertz for Military and Security Applications, Proceedings of SPIE vol. 5070 (2003), pp. 71-82.

Ives, R. Lawrence, "IVEC Summary, Session 2, Sources I" 2002.

Jonietz, Erika, "Nano Antenna Gold nanospheres show path to all-optical computing," Technology Review, Dec. 2005/Jan. 2006, p. 32.

Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA, Nov. 1995, pp. 117-121.

Joo, Youngcheol et al., "Fabrication of Monolithic Microchannels for IC Chip Cooling," 1995, Mechanical, Aerospace and Nuclear Engineering Department, University of California at Los Angeles.

Jung, K.B. et al., "Patterning of Cu, Co, Fe, and Ag for magnetic nanostructures," J. Vac. Sci. Technol. A 15(3), May/Jun. 1997, pp. 1780-1784.

Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.

Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.

Korbly, S.E. et al., "Progress on a Smith-Purcell Radiation Bunch Length Diagnostic," Plasma Science and Fusion Center, MIT, Cambridge, MA.

Kormann, T. et al., "A Photoelectron Source for the Study of Smith-Purcell Radiation".

Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.

Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.

Manohara, Harish et al., "Field Emission Testing of Carbon Nanotubes for THz Frequency Vacuum Microtube Sources." Abstract. Dec. 2003. from SPIEWeb.

Manohara, Harish M. et al., "Design and Fabrication of a THz Nanoklystron".

Manohara, Harish M. et al., "Design and Fabrication of a THz Nanoklystron" (www.sofia.usra.edu/det_workshop/ posters/session 3/3-43manohara_poster.pdf), PowerPoint Presentation.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (may date the Manohara documents).

Mokhoff, Nicolas, "Optical-speed light detector promises fast space talk," EETimes Online, Mar. 20, 2006, from website: www.eetimes.com/showArticle.jhtml?articleID=183701047.

Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.

Nguyen, Phucanh et al., "Reactive ion etch of patterned and blanket silver thin films in Cl2/O2 and O2 glow discharges," J. Vac. Sci, Technol. B 17(5), Sep./Oct. 1999, American Vacuum Society, pp. 2204-2209.

Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.

Phototonics Research, "Surface-Plasmon-Enhanced Random Laser Demonstrated," Phototonics Spectra, Feb. 2005, pp. 112-113.

Platt, C.L. et al., "A New Resonator Design for Smith-Purcell Free Electron Lasers," 6Q19, p. 296.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.

Shih, I. et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1D02, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1-205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

METHOD AND STRUCTURE FOR COUPLING TWO MICROCIRCUITS

INTRODUCTION

This relates in general to coupling signals and/or power between two microcircuits and, more particularly, using an electron beam to couple the signals and/or power between the two microcircuits.

Semiconductor package manufacturers are constantly striving to keep up with the increasing speed and number of signals coupled between microcircuits. For example, a microcircuit such as a microprocessor can contain billions of transistors with clock speeds greater than 3 gigahertz. Further, as microcircuits have evolved to smaller sizes, there is less space to route signals between the microcircuits. Hence, there is a need to improve the structures for coupling signals between microcircuits. Typically, the signals are routed between microcircuits using metallization systems that can include a plurality of solder balls, wire bonds, metal traces, bonding pads and the like.

Figure 1:
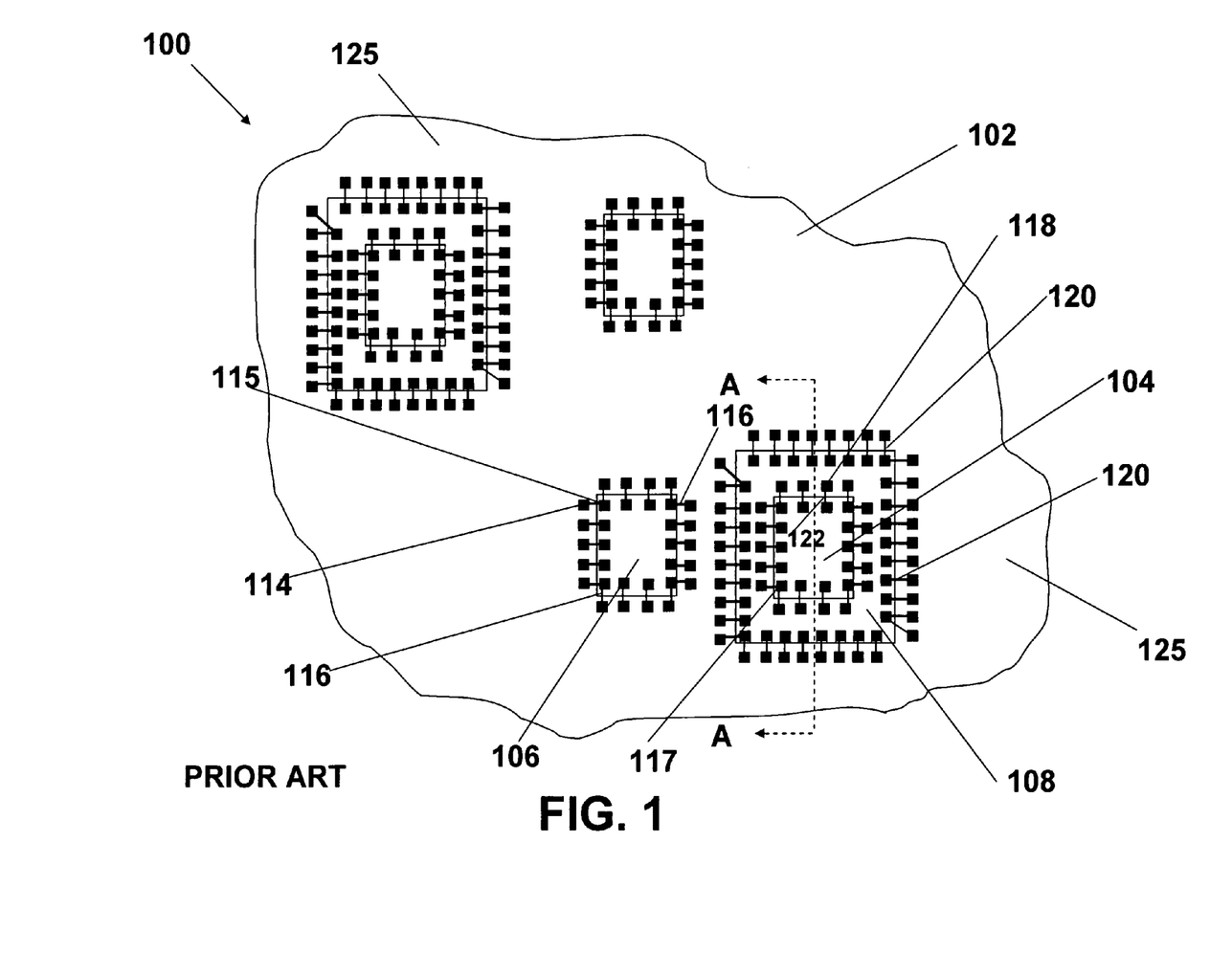
FIG. 1 is an enlarged top-view of a portion of a prior art multi-chip module.
Figure 2:
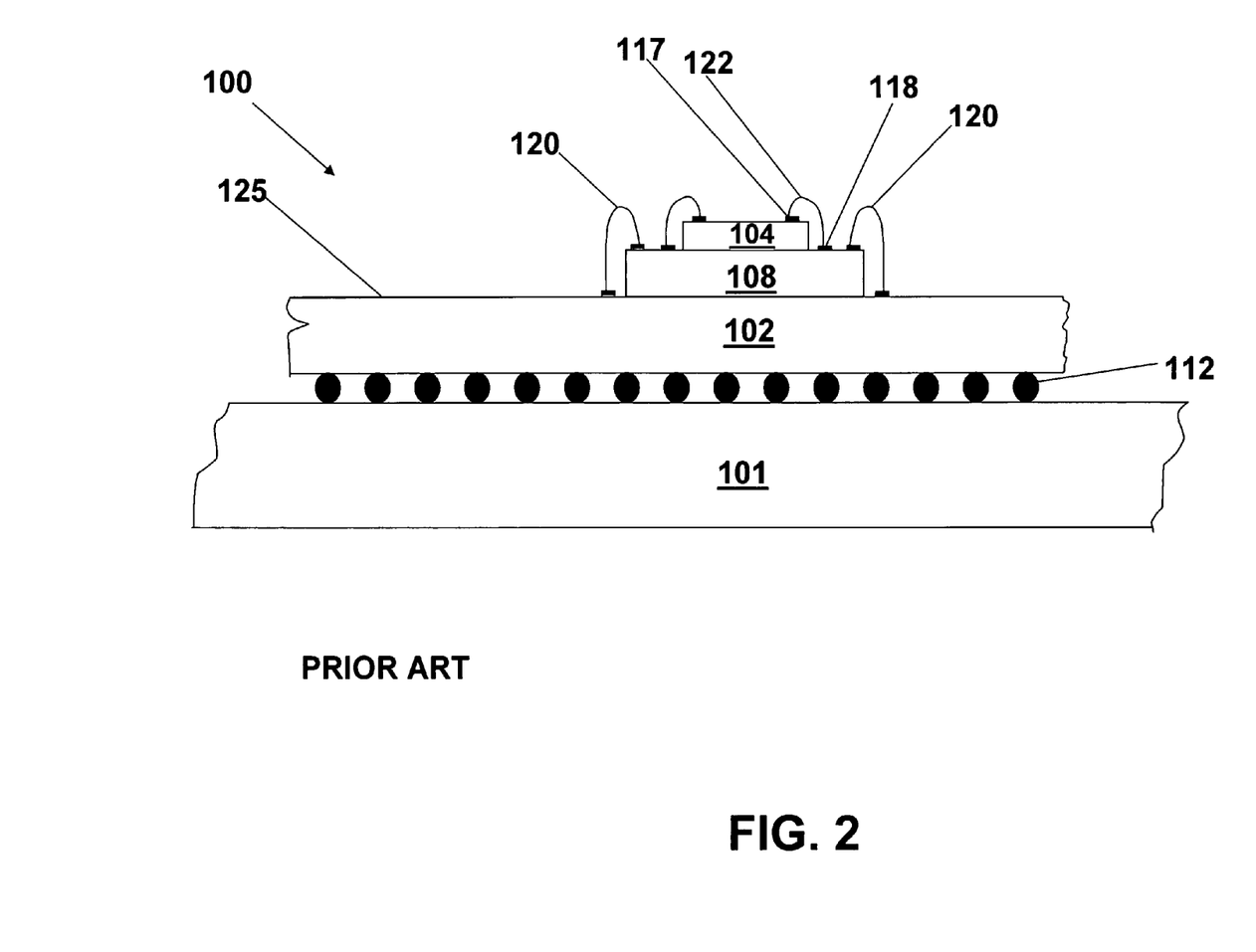
FIG. 2 is a cross-section from a portion of FIG. 1 showing a chip-on-chip configuration of the prior art multi-chip module.

A component can include microcircuits contained within individual packages. The component mounted on a printed circuit board can provide poor utilization of space, because the microcircuits are generally smaller than the packages that contain them. Further, signal delays can frequently occur due to the large space between the microcircuits created by the individual packages. FIG. 1 is an enlarged top-view of a portion of a prior art device 100, or multi-chip module (MCM), or a system in a package (SIP), illustrating a substrate 102 having a surface 125, which harbors a plurality of microcircuits not contained by individual packages. The substrate 102 can contain a plurality of conductive layers (not shown) and is typically electrically coupled to the printed circuit board. A microcircuit 106 is electrically coupled via wire bonds 116 between bonding pads 114 and 115 on the substrate 102 and the microcircuit 106, respectively. Similarly, a microcircuit 108, just to the right of the microcircuit 106, is electrically coupled via wire bonds 120 to the substrate 102. Hence, any power or signals received by the microcircuits 106 and 108 are routed through the wire bonds 116 and 120, respectively. Since microcircuits 106 and 108 are used without individual packages, the MCM 100 provides a structure for improving speed and density. Further, the MCM or device 100 can comprise a combination of microcircuits of various semiconductor technologies to optimize the overall performance. FIG. 2 is an enlarged cross-sectional view of a portion of FIG. 1 showing the prior art MCM 100 electrically coupled to a printed circuit board 101 via solder balls 112. Device 108 is electrically coupled to the substrate 102 via wire bonds 120, and a device 104 is disposed on the device 108. A chip-on-chip configuration such as between microcircuits 104 and 108 can provide for a reduced signal delay. For example, the chip-on-chip configuration of microcircuits 104 and 108 can respectively include a memory device and a microprocessor. Due to the short distance between microcircuits 104 and 108, this configuration can reduce the signal delay, thereby meeting a need for a high data transfer rate. Power and signals are routed through wire bonds 122 coupled to bond pads 117 and 118 between the microcircuits 104 and 108, respectively. Whether the microcircuits are mounted side-by-side as shown in FIG. 1 or chip-on-chip as illustrated in FIG. 2, the electrical coupling between the microcircuits is generally through wire bonds. As further development continues, the speed and density of the microcircuits will continue to increase, including a further scaling down of the microcircuits. Thus, a greater demand for electrically coupling between microcircuits is anticipated.

We describe an improved structure for electrically coupling between microcircuits. In an example of such a structure, a substrate has a surface on which a first microcircuit is disposed. An electron source generates an electron beam which then electrically couples signals from the first microcircuit with an adjacent second microcircuit.

DETAILED DESCRIPTION OF THE DRAWINGS

Methods of making a device for detecting an electromagnetic wave as can be employed herein may use the techniques included under U.S. application Ser. No. 10/917,511, filed on Aug. 13, 2004, entitled "Patterning Thin Metal Films by Dry Reactive Ion Etching" and/or U.S. application Ser. No. 11/203,407, filed Aug. 15, 2005, entitled "Method of Patterning Ultra-Small Structures," each of which is commonly owned at the time of filing, the entire contents of each of which are incorporated herein by reference.

The devices described herein may also employ various similar or different example resonant structures like those described in one or more of the following, each of which is incorporated herein by reference:

U.S. application Ser. No. 11/243,476, filed Oct. 5, 2005, entitled, "Structures and Methods for Coupling Energy from an Electromagnetic Wave;"

U.S. application Ser. No. 11/243,477, filed Oct. 5, 2005, entitled, "Electron Beam Induced Resonance;"

U.S. application Ser. No. 11/238,991, filed Sep. 30, 2005, entitled, "Ultra-Small Resonating Charged Particle Beam Modulator;"

U.S. application Ser. No. 11/302,471, filed Dec. 14, 2005, entitled, "Coupled Nano-Resonating Energy Emitting Structures;"

U.S. application Ser. No. 11/325,432, filed Jan. 5, 2006, entitled, "Resonant Structure-Based Display;"

U.S. application Ser. No. 11/325,448, filed Jan. 5, 2006, entitled, "Selectable Frequency Light Emitter;"

U.S. application Ser. No. 11/325,571, filed Jan. 5, 2006, entitled, "Switching Micro-Resonant Structures by Modulating a Beam of Charged Particles;" and U.S. application Ser. No. 11/325,534, filed Jan. 5, 2006, entitled, "Switching Micro-Resonant Structures Using at Least One Director."

A device can include a multi-chip module (MCM), or a system in a package (SIP) comprising die or microcircuits. Generally, a structure and method that employs an electron beam for electrically coupling between the microcircuits is described. In a first embodiment, the electron beam is routed between two microcircuits disposed on a substrate. In a second embodiment, the electron beam travels from a first microcircuit on the substrate to a second microcircuit disposed on the first microcircuit. In a third embodiment, a plurality of electron beams having a ribbon shape electrically couples between the first and second microcircuits. Other example embodiments will be recognizable to the artisan upon review of the present disclosure. The fabrication of the structures can be economically included in a final metallization step of the microcircuits.

In the following detailed description, taken in conjunction with the accompanying drawing figures, like reference numbers designate like elements.

Figure 3:
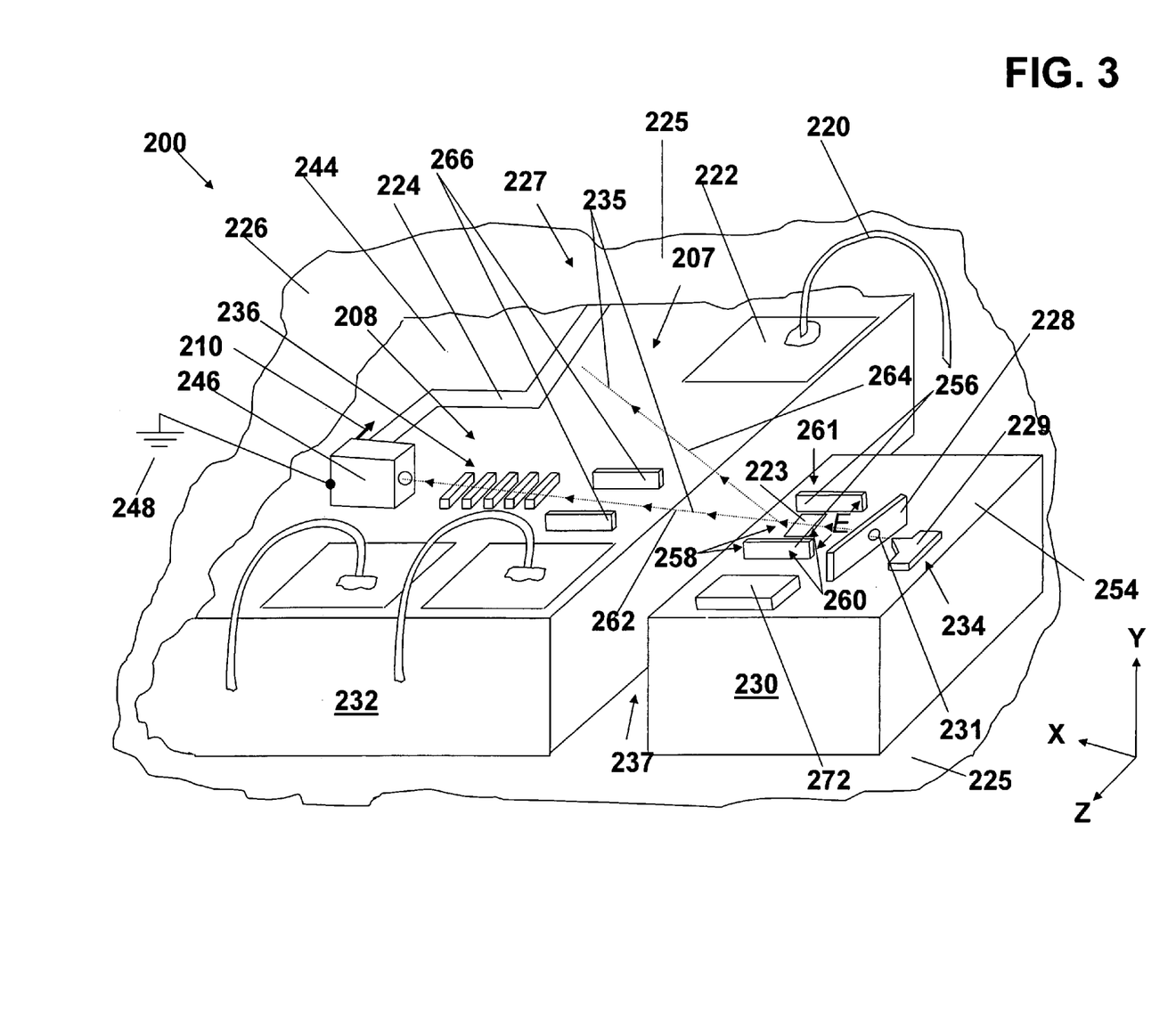
FIG. 3 is an enlarged perspective-view of a portion of a multi-chip module illustrating microcircuits in a side-by-side configuration and an electron beam coupling them.
Figure 4:
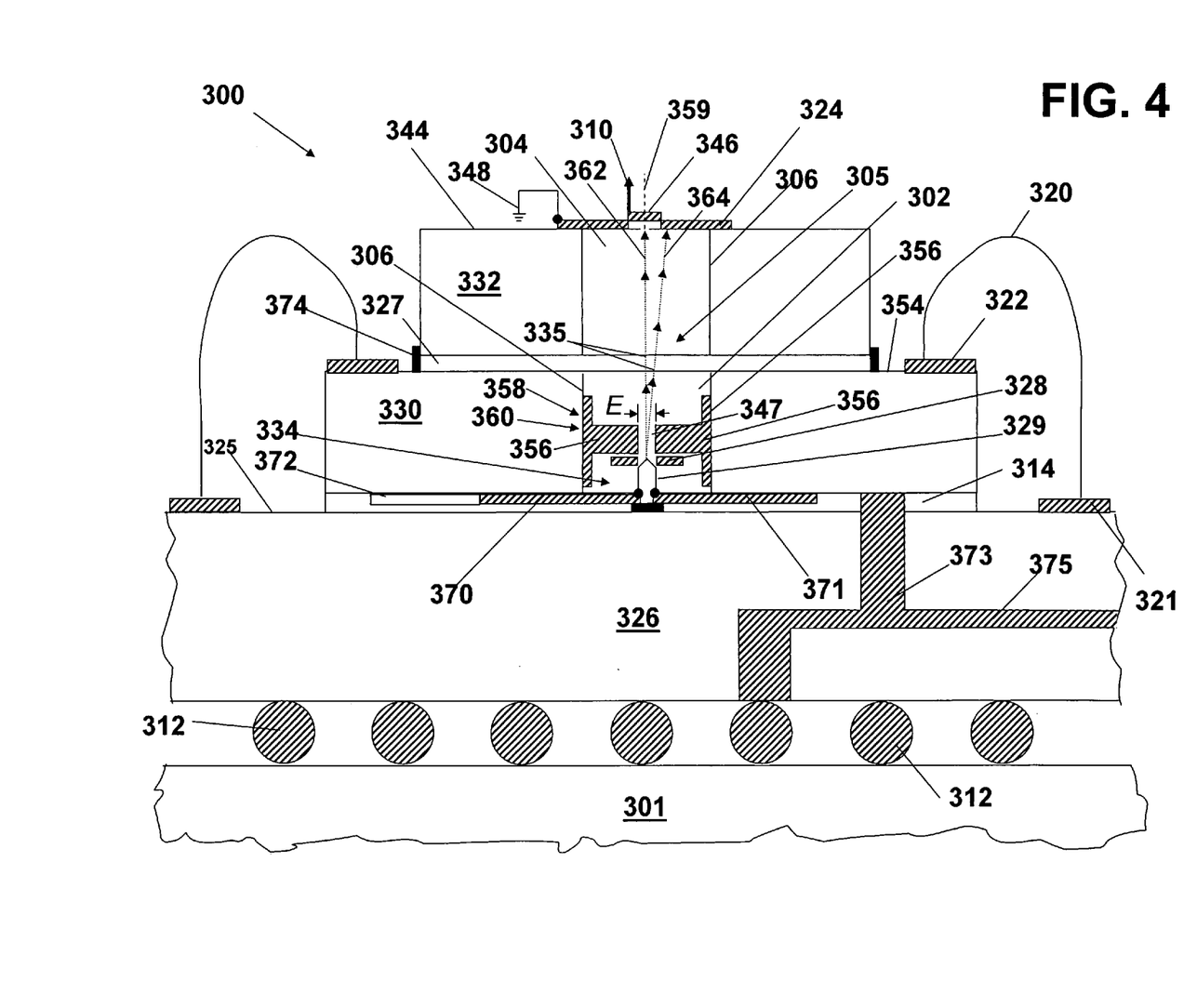
FIG. 4 is an enlarged cross-sectional view showing a chip-on-chip configuration.

FIG. 3 is an enlarged perspective-view illustrating an electron beam 235 for electrically coupling between microcircuits 230 and 232. The microcircuits 230 and 232 are positioned adjacent to each other and are secured to a surface 225 of a substrate 226. The microcircuits 230 and 232 can form a portion of a multi-chip module (MCM) or device 200. To reduce a mismatch of thermal expansion coefficients, an underfill (not shown) can be included between the surface 225 of the substrate 226 and the microcircuits 230 and 232. An electron gun 234 formed on a primary surface 254 of the microcircuit 230 includes a cathode 229 and an anode 228. The electron gun 234 can be formed in a final metallization step in the fabrication of the microcircuit 230. The technique for making the electron gun 234 can take a variety of forms and is not limiting. The received electrical power for microcircuit 230 can be provided via the metallization within substrate 226 (e.g. as shown in FIG. 4).

A portion of the received power (above) can be coupled to the DC-to-DC converter 272. A DC-to-DC converter 272 shown secured to the primary surface 254 of the microcircuit 230 can be used to provide a high-voltage output to the electron gun 234. The high voltage of the DC-to-DC converter can include a voltage from about 200 to about 150,000. The DC-to-DC converter 272 can include fly-back and forward type configurations. The type of configuration for the DC-to-DC converter 272 is not critical. In another embodiment, a layer (not shown) within the substrate 226 can be isolated and scaled to provide the high voltage to the electron gun 234.

The electron beam 235 is formed along a path that is generally a line shape through an opening 231 of the anode 228. A space 227 around the microcircuits 230 and 232 including the path of the electron beam 235 is evacuated or filled with inert gases. The electron beam 235 can travel along the path to across a gap 237 between the microcircuits 230 and 232. The gap 237 can span a distance over a range from about 10 nanometers to about several meters. The gap 237 provides electrical isolation between the microcircuit 232 and the high-voltage of microcircuit 230. After traversing the gap 237, the electron beam 235 travels over a major surface 244 of the device 232. The electron beam 235 can interact with features formed on the major surface 244. The features can include a plurality of tines or an arrangement of metal rows 236 disposed on or extending from the major surface 244. Electromagnetic waves (EM) can be generated or emitted when the electron beam 235 travels over and interacts with the metal rows 236. The type of function performed by this interaction of the electron beam 235 with features formed on the major surface 244 is not critical.

A plurality of active elements, such as diodes and transistors 207, and passive elements 208 make up a substantial portion of the microcircuit 232 and are generally formed on the major surface 244. Structures of transistors and passive elements are well known in the art. Hence, a detailed illustration of the plurality of transistors 207 and passive elements 208 on the major surface 244 is not shown. The plurality of transistors 207 can include a spectrum of technologies such as CMOS, BiCMOS, Bipolar, and any other known or future transistor type. The plurality of transistors 207 can be configured to form a register, a counter, a latch, a decoder, and any other electronic device of any sort. The passive elements 208 can include resistors, inductors and capacitors. The electrical load comprises the power needed by the plurality of transistors 207 and passive elements 208 to appropriately function or operate the microcircuit 232.

A receiver referred to as a receiving structure 246, such as a Faraday cup, is formed on the major surface 244 and can electrically couple the electron beam 235 from the microcircuit 230. The receiving structure 246 can be connected between a voltage bus 224 and a ground 248. The voltage bus 224 can be connected to the electrical load (above) of the microcircuit 232. Power can be coupled between the microcircuits 230 and 232 without a metallization system such as metal traces or bond wires. Hence, the electron beam 235 can electrically couple power between the microcircuits 230 and 232 without the use of a metallization system.

Plates 256 are secured to the primary surface 254 of the microcircuit 230 and can be formed in a final metallization step in the fabrication of the microcircuit 230. A voltage can be applied to the plates 256 to provide an electric field E between the plates 256. The electron beam 235 can travel along a path between the plates 256. The electric field E can interact with the electron beam 235 by deflecting the electron beam 235 horizontally (i.e., the X-Z plane shown in FIG. 3) along a particular path. For example, a signal (e.g., voltage level) can be applied to the plates 256 providing the electric field E having a particular magnitude and direction. The signal can include at least one signal such as a first 258 and/or second 260 signal. The electron beam 235 passes between the plates 256, which receive the first signal 258. The electron beam 235 is deflected by the field E between the plates 256 and travels along the particular path referred to as a path 262. The electron beam 235 traveling along the path 262 couples to the receiving structure 246. Further, a second signal 260 is coupled to the plates 256 and deflects the electron beam 235 along a path 264 that does not couple the electron beam 235 to the receiving structure 246. The first 258 and second 260 signals can be used to deflect or angularly modulate the electron beam 235 respectively on and off the receiving structure 246. The electron beam 235 coupled on and off the receiving structure 246 respectively establishes first and second logic states. Thus, a signal 210 is detected by coupling the electron beam 235 on and off the receiving structure 246. Hence, the electron beam 235 can communicate between microcircuits 230 and 232 without a metallization connection. The signal 210 is electrically coupled from the electron beam 235 between the microcircuits 230 and 232, thereby enabling communications. In a similar manner as above, the electron beam 235 can be deflected vertically (i.e., the X-Y plane shown in FIG. 3) on and off the receiving structure 246 by applying the first 258 and second 260 signals to a pad 223. The electron beam 235 passes the pad 223 in close proximity allowing coulomb scattering, often referred to in the art as coulombic forces, to deflect the electron beam 235. The combination of the plates 256 and the pad 223 can be referred to as a deflector 261. This provides a structure and method for electrically coupling data between microcircuits. In another embodiment (not shown), the plates 256 can use a magnetic field to vary the path of the electron beam 235. The method for deflecting the electron bean 235 can take a variety of forms and is not limiting.

Adjustment plates 266 can be formed on the major surface 244 of microcircuit 232 at the final metallization step during fabrication. The adjustment plates 266 can be used as a final adjustment of the electron beam's 235 path.

FIG. 4 is an enlarged cross-sectional view of a portion of a MCM or device 300 illustrating an electron beam 335 for electrically coupling between microcircuits 330 and 332. A substrate 326 of the MCM 300 is shown electrically connected to a printed circuit board 301 by solder balls 312. The microcircuit 330 can be secured to a top surface 325 of the substrate 326 via an underfill 314. An underfill 314 can be disposed between a top surface 325 of the substrate 326 and the microcircuit 330. Electrical connections between the microcircuit 330 and the substrate 326 can include coupling between bonding pads 321 and 322 through a bond wire 320. Also, an electrical connection between the microcircuit 330 can include a conductive layer 375, which is routed by a conductive via 373 directly to microcircuit 330.

The microcircuits 330 and 332 include vias 302 and 304, respectively. The microcircuit 332 is disposed adjacent to or on the microcircuit 330. A space 327 is typically formed between a primary surface 354 of the microcircuit 330 and the microcircuit 332 to electrically isolate the high voltage (discussed below) on the microcircuit 330 from the microcircuit 332. A seal 374 is typically formed around the MCM 300 to isolate the space 327 from the external atmosphere. The microcircuit 332 is generally disposed on the microcircuit 330 such that the vias 302 and 304 are generally aligned to form a channel 305 between the microcircuits 330 and 332. The channel 305 is typically provided as a region for routing the electron beam 335 between the microcircuits 330 and 332. The channel 305 is typically connected to the space 327 and evacuated to the same vacuum level as the space 327. The vias 302 and 304 have a sidewall 306, which generally forms the boundary of the channel 305.

An electron gun 334 includes a cathode 329 and an anode 328 and is formed within the via 302 of the microcircuit 330. To boost the voltage on the cathode 329, one side of the cathode 329 can be coupled to a DC-to-DC converter 372 by a metal trace 370. The other side of the cathode 329 can be coupled to a grounded metal trace 371. The electron beam 335 emits from the cathode 329 of the electron gun 334 and travels along the channel 305.

Plates 356 can be formed on the sidewall 306 in a final metallization step of the microcircuit 330. A voltage is typically applied across the plates 356 to provide an electric field E across an opening 347 between the plates 356 as shown in FIG. 4. The electron beam 335 can be deflected by the electric field E to a different path. For example, on applying a signal such as a first signal 358 between the plates 356, the electron beam 335 travels on a path 362 aligned with the center 359 of the channel 305. Further, on applying the signal such as a second signal 360 across the plates 356, the electron beam 335 traverses a path 364 not aligned with the center 359 of the channel 305.

A receiver or receiving structure 346 is formed adjacent to the channel 305 or over the via 304 and extended from a major surface 344 of the microcircuit 332. When the signal such as the first signal 358 is applied to the plates 356, the electron beam 335 travels along the path 362 aligned with the center 359 and is collected by the receiving structure 346. A first embodiment of coupling energy or delivering power to the microcircuit 332 can be provided by the electron beam 335. When delivering power, the receiving structure 346 can be connected between the electrical load of the microcircuit 332 and ground (see FIG. 3 for description of electrical load). For example, the receiving structure 346 can be connected between a ground 348 and a voltage bus 324, which connects to the electrical load of the microcircuit 332. Further, in a second embodiment communications can be established between the microcircuits 330 and 332 by coupling the electron beam 335 on and off the receiving structure 346. By applying the signal such as the first 358 and second 360 signals to the plates 356, the electron beam 335 can follow along the first 362 and second 364 paths, respectively. When the electron beam 335 is coupled on and off the receiving structure 346, information can be carried between the microcircuits 330 and 332. This can establish an output signal 310 at the receiving structure 346. The output signal 310 can be used on microcircuit 332 to perform various functions, such as the input to a counter circuit.

Figure 5:
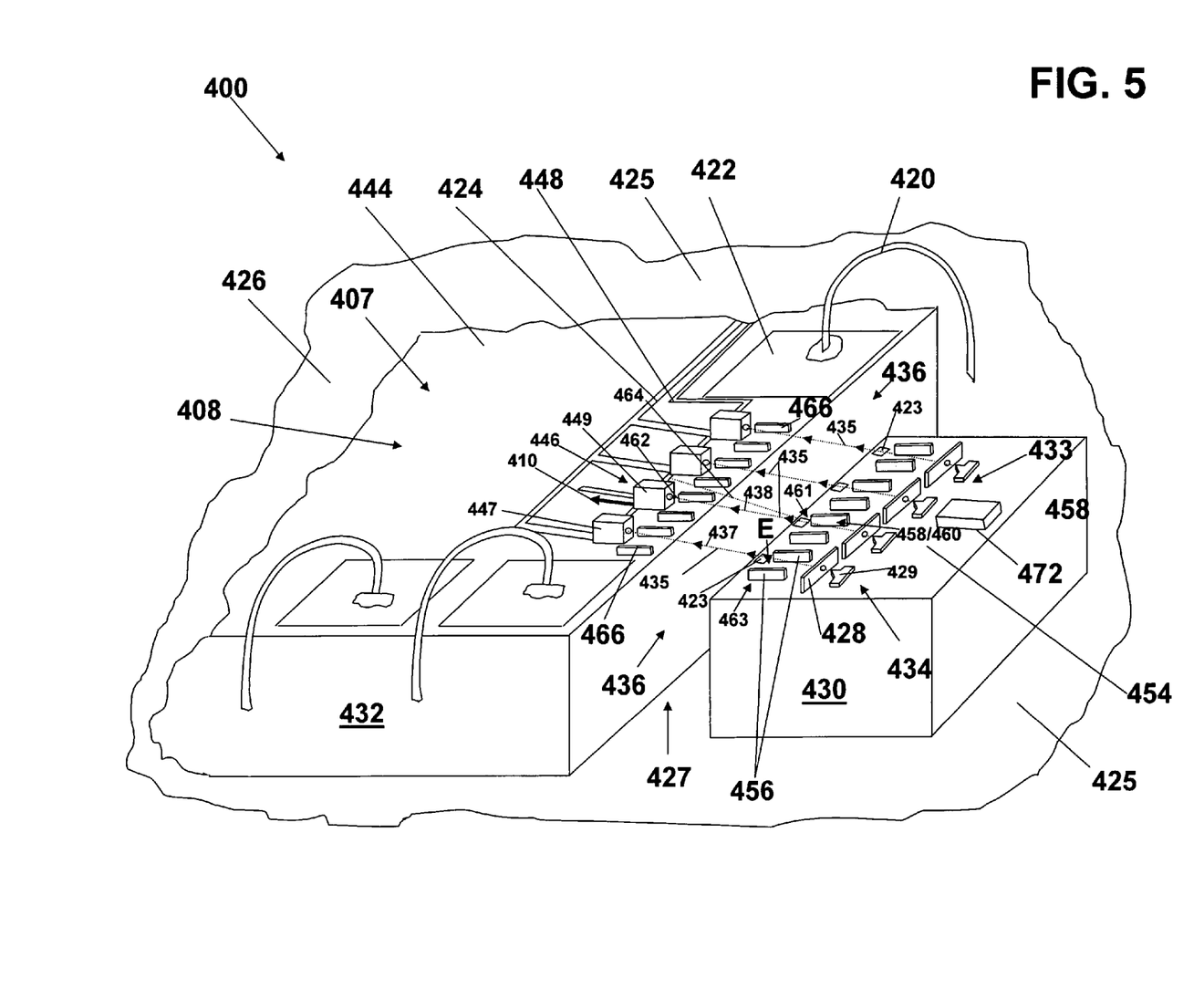
FIG. 5 is an enlarged perspective-view of a side-by-side configuration with an electron beam having a ribbon shape.

FIG. 5 is an enlarged perspective-view of a portion of a device 400 showing a plurality of electron beams 436 electrically coupling between microcircuits 430 and 432. The microcircuits 430 and 432 are disposed adjacent to one another on a surface 425 of a substrate 426. The plurality of electron beams 436 comprises at least two electron beams 435. In a manner as mentioned previously under FIG. 3, an electron gun 434 is formed on a primary surface 454 of the microcircuit 430. The electron gun 434 comprises a cathode 429 and an anode 428 and emits and shapes the electron beam 435, respectively. A voltage converter 472 as shown on the primary surface 454 can be used to increase the voltage and is coupled to the electron gun 434. The device 400 includes a plurality of electron guns 433 to provide the plurality of electron beams 436. The plurality of electron beams 436 travels across a gap 427 between the microcircuits 430 and 432 and can appear as a ribbon shape. Further, the electron source or electron gun 434 in another embodiment can emit a plurality of electron beams 436.

The plurality of electron beams 436 can electrically couple to a plurality of receivers or plurality of receiving structures 446 formed on a major surface 444 of the microcircuit 432. Each receiving structure of the plurality of receiving structures 446 can electrically connect differently to the microcircuit 432. For example, a receiving structure 447 of the plurality of receiving structures 446 is connected between ground 448 and the electrical load via a voltage bus 424 on the major surface 444 (see FIG. 3 for description of electrical load). In this embodiment, the electrical load can comprise active elements such as a plurality of transistors 407 and passive elements 408 formed on the major surface 444. Further, a receiving structure 449 of the plurality of receiving structures 446 can be coupled to a logic gate (not shown) used for digital signal processing.

The path of any one electron beam 435 including electron beams 437 and 438 of the plurality of electron beams 436 can be controlled separately from any other beam of the plurality of electron beams 436. For example, the electron beam 437 of the plurality of electron beams 436 is controlled by a deflector 463 including plates 456 and a pad 423 adjacent to the electron beam 437. The plates 456 and pad 423 can control the path of the electron beam 437 using electric or magnetic fields or the columbic effect as discussed under FIG. 3. Further, an electron beam 438, adjacent to the electron beam 437, is controlled by the deflector 461 adjacent to the electron beam 438. Hence, one advantage of using the plurality of electron beams 436 is the ability to electrically couple a plurality of signals to the microcircuit 432.

Any electron beam 435 of the plurality of beams 436 can perform a particular function such as providing power or data transfer to the microcircuit 432. This depends on how a particular receiving structure is coupled to the microcircuit 432. For example, as previously mentioned, the receiving structure 447 is connected between ground 448 and the voltage bus 424. Thus, the receiving structure 447 can be used to couple energy or power from the respective electron beam 437. Further, the receiving structure 449 coupled to the logic gate, as previously mentioned, can function using the deflector 461 to modulate or deflect the electron beam 438 on and off the receiving structure 449 adjacent to the path of the electron beam 438. For example, a signal comprising first 458 and second 460 signals are applied to the deflector 461. The deflector 461 can be used to deflect the electron beam 438 on first 462 and second 464 paths, respectively. This switches the electron beam 438 on and off the receiving structure 449. Thus, a signal 410 from microcircuit 430 can be detected, for example, by switching the electron beam 438 on and off the receiving structure 449 on microcircuit 432.

As in FIG. 3, microcircuit 432 can include a plurality of adjustment plates 466 on the major surface 444 of the microcircuit 432.

By now it should be appreciated a device such as a multi-chip module or system in a package can include at least one microcircuit. An electron beam is provided to couple energy from the one microcircuit. At least one other microcircuit can receive the electron beam. Further, the electron beam can provide either power or data, or both, to the microcircuit receiving the electron beam. The structure within the multi-chip module can include microcircuits configured in both side-by-side and chip-on-chip configurations. The electron beam provides a structure and method for electrically coupling between microcircuits. Further, the electron beam can perform a variety of functions on the second microcircuit. Further yet, providing the structures for electrically coupling the electron beam between microcircuits can be made in a final metallization step in the fabrication of the microcircuits.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A device for coupling a signal, comprising:
    a substrate having a surface;
    a first microcircuit disposed on the surface;
    an electron source for generating an electron beam; and
    a second microcircuit disposed adjacent to the first microcircuit, wherein the electron beam electrically couples the signal from the first microcircuit to the second microcircuit.

2. The device of claim 1 wherein the electron beam is modulated by the signal.

3. The device of claim 1, further comprising a deflector to couple the signal with the electron beam.

4. The device of claim 3, wherein the electron beam is angularly modulated on passing the deflector.

5. The device of claim 3, wherein the deflector comprises plates and a pad.

6. The device of claim 1, wherein the signal is coupled at the electron source.

7. The device of claim 6, wherein the electron beam is modulated by the signal.

8. The device of claim 6, where the signal pulses the electron beam.

9. The device of claim 6, wherein the electron source comprises a cathode.

10. The device of claim 1, further comprising a voltage converter formed on the first microcircuit.

11. The device of claim 10, wherein the voltage converter is connected to the electron source.

12. The device of claim 1, wherein the electron source produces a plurality of electron beams.

13. The device of claim 12, wherein the plurality of electron beams are in a ribbon shape.

14. The device of claim 1, wherein the second microcircuit is also disposed on the surface.

15. The device of claim 1, further comprising a receiver accepting the electron beam and coupling the signal to the second microcircuit.

16. The device of claim 15, wherein the second microcircuit comprises a plurality of active and passive elements having an electrical load.

17. The device of claim 16, wherein the receiver is electrically connected to the electrical load and wherein the signal includes at least a power signal delivered by the receiver to the second microcircuit to power the electrical load.

18. The device of claim 15, wherein the receiver comprises a Faraday cup.

19. The device of claim 1, further comprising adjustment plates disposed on the second microcircuit.

20. The device of claim 14, further comprising aligned first and second vias through the first and second microcircuits, respectively.

21. The device of claim 20, wherein the electron beam travels from the electron source through the first and second vias.

22. The device of claim 21, wherein the electron beam is modulated by the signal.

23. The device of claim 22, further comprising a receiver formed adjacent to the second via.

24. The device of claim 23, wherein the receiver accepts the electron beam and couples therefrom the signal to the second microcircuit.

25. The device of claim 1, wherein electrically coupling comprises modulation and detection of the electron beam on the first and second microcircuits, respectively.

26. A method for electrically coupling a signal comprising:
    providing first and second microcircuits formed on at least one substrate and the first microcircuit disposed substantially in a line of sight with the second microcircuit;
    generating an electron beam; and
    electrically coupling the electron beam with the signal to carry the signal from the first microcircuit to the second microcircuit substantially on the line of sight.

27. The method of claim 26, wherein the electron beam transfers power from the first microcircuit to the second microcircuit.

28. The method of claim 26, further including modulating the electron beam using the signal.

29. The method of claim 28, wherein modulating comprises angularly modulating the electron beam.

30. The method of claim 29, wherein angularly modulating the electron beam comprises:
    providing a deflector on the first microcircuit;
    passing the electron beam by the deflector;
    providing a field across the deflector; and
    bending the electron beam using the field.

31. The method of claim 30, further including the step of applying the signal across the deflector.

32. The method of claim 31, wherein bending the electron beam comprises deflecting the electron beam to indicate a condition of the signal received at the deflector.

33. The method of claim 26, wherein electrically coupling the electron beam, comprises:
   providing a receiver; and
   detecting pulses of the electron beam at the receiver.

34. The method of claim 26, further comprising arranging metal structures in a pattern on the second microcircuit.

35. The method of claim 34, further comprising passing the electron beam proximate the metal rows to generate an electromagnetic wave.

36. The method of claim 35, wherein arranging the metal structures comprises aligning the metal structures in rows.

37. A system to communicate a signal from a first circuit to a physically displaced second circuit, comprising:
   an electron beam source producing an electron beam passing near an encoding portion of the first circuit and a decoding portion of the second circuit;
   a modulator in the encoding portion, the modulator receiving the signal from the first circuit and altering the electron beam to encode the signal onto the electron beam as the electron beam passes near the encoding portion;
   the decoding portion effectively recovering the signal as the electron beam passes near the decoding portion, and delivering the recovered signal to the second circuit.

38. A system according to claim 37, wherein the signal is one or more from the group consisting of: a power signal and a data signal.

39. A system according to claim 37, wherein the decoding portion includes at least one structure that resonates as the electron beam passes.

40. A system according to claim 37, wherein the first and second circuits are physically displaced on a common substrate, and the electron beam source produces an electron beam passing near an encoding portion of the first circuit at one location of the common substrate and a decoding portion of the second circuit at another location of the common substrate.

41. A multi-chip module, comprising:
   a transmission interface having as an input a signal from a first chip of the multi-chip module and interacting with an electron beam passing uninterrupted by a surface of the transmission interface to couple the signal with the electron beam;
   a receiver interface interacting with the electron beam to substantially decouple the signal from the electron beam and deliver the signal to a second chip of the multi-chip module.

* * * * *